United States Patent [19]
Charmakadze et al.

[11] 3,958,265
[45] May 18, 1976

[54] SEMICONDUCTOR LIGHT-EMITTING DIODE AND METHOD FOR PRODUCING SAME

[76] Inventors: Revaz Alexandrovich Charmakadze, prospekt Vazha Pshavela, 6, vartal, 24 korpus, kv. 22; Rafael Iraklievich Chikovani, prospekt Vazha Pshavela, 39b, kv. 53, both of Tbilisi; Zhores Ivanovich Alferov, Olginskaya ulitsa, 9, korpus 3, kv. 15, Leningrad, all of U.S.S.R.

[22] Filed: May 2, 1974

[21] Appl. No.: 466,505

[30] Foreign Application Priority Data
May 28, 1973 U.S.S.R............................. 1922832

[52] U.S. Cl.................................. 357/17; 357/16; 357/18; 357/61
[51] Int. Cl.² ................ H01L 33/00; H01L 29/161; H01L 29/205
[58] Field of Search .................. 357/17, 18, 16, 58, 357/61

[56] References Cited
OTHER PUBLICATIONS
Boburka et al., *IBM Tech. Disel. Bull.*, Vol. 16, No. 2, (July 1973), pp. 554.
Alferov et al., *Soviet Physics*, Vol. 3, No. 9, Mar. 1970, pp. 1107–1110.

*Primary Examiner*—Martin H. Edlow
*Attorney, Agent, or Firm*—Holman & Stern

[57] ABSTRACT

A semiconductor light-emitting diode comprising a $p^+$-type GaAs substrate, an epitaxial p-layer of a monocrystalline solid solution of GaAlAs doped with Zn, an epitaxial n-layer of a monocrystalline solid solution of GaAlAs doped with Te, a heterojunction formed between said p- and n-layers which are doped to approximately the same concentration level, a compensated layer of a monocrystalline solid solution of GaAlAs doped with Zn and Te to a concentration level similar to that in said epitaxial n-layer, said compensated layer being disposed between said p- and n-layers and having a thickness commensurate with the diffusion length of the injected charge carriers in said n-layer. The method for producing said semiconductor light-emitting diode consists in that a substrate of GaAs and two liquid phases of Ga with Al saturated with arsenic, one containing Zn and Te, and the other containing Te are taken; the first liquid phase is brought in contact with the substrate to grow the p-layer, then a layer of the first liquid phase, whose thickness is controlled, is left on the substrate, and the second liquid phase is brought in contact therewith to alternately grow the compensated layer and the n-layer.

17 Claims, 12 Drawing Figures

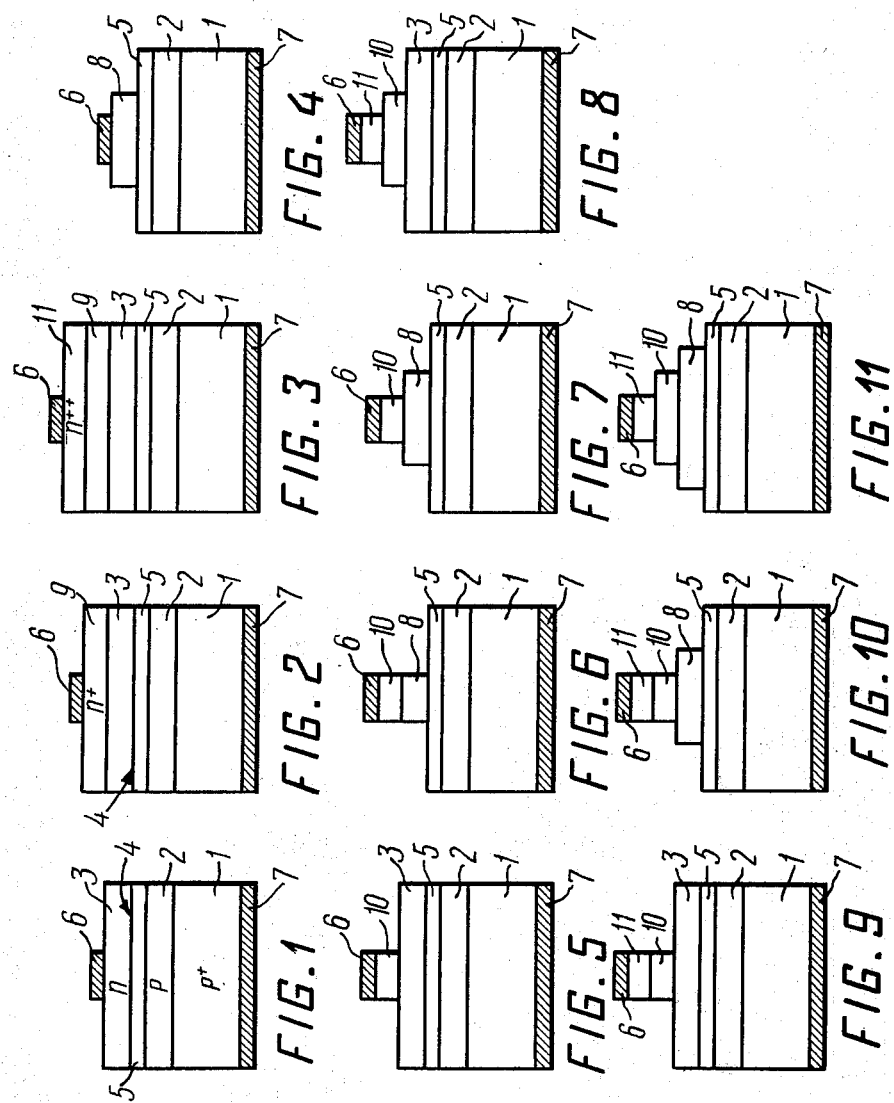

SEMICONDUCTOR LIGHT-EMITTING DIODE AND METHOD FOR PRODUCING SAME

The present invention relates to semiconductor devices, and more particularly to a semiconductor light-emitting diode, and a method for producing same.

The invention can most advantageously be used in semiconductor injection luminescent devices, photodiode devices, digital, and alphameric displays and other data display means.

Semi-conductor light-emitting diodes based on solid solutions of GaAlAs doped with Zn, and Te at the same time, with a thicker layer being grown on the thin active layer of the solid solution (about 2 m$\mu$ thick) to ensure light emission transparency are known in the art. However, another GaAs layer has to be applied to the surface of the thus obtained structure to ensure ohmic contact.

The prior art has inherent disadvantages which lie in the absence of the compensated active layer, which reduces the light yield due to self-absorption within the volume of the semiconductor material, as well as for the fact that the presence of the last GaAs layer which, as thin as it is, absorbs a considerable amount of the recombination emission. The external quantum efficiency of the best light-emitting diodes is 0.3% at 300°K.

A method for producing semiconductor light-emitting diodes is known based on the liquid-phase epitaxy method with the presence of two dopants, Zn and Te, in the melt of Ga with Al saturated with arsenic. By varying the rate of cooling the melt in the process of growth, a variation in the segregation coefficients, and their ratio, is obtained as a result of which the epitaxial layers alternate, in the process of growth, as to their type of conductivity.

A disadvantage of this method lies in the impossibility of providing for a compensated active layer, as well as for high intensity and efficiency of light emission.

Another semiconductor light-emitting diode is known comprising a p$^+$-type GaAs substrate, an epitaxial p-layer of a monocrystalline solid solution of GaAlAs doped with Te, and a heterojunction between these epitaxial layers. The epitaxial layers are doped to practically the same concentration level.

This semiconductor light-emitting diode, however, cannot be obtained by any one of the known methods.

It is an object of the present invention to provide a semiconductor light-emitting diode featuring a high efficiency of emissive recombination as well as a high intensity of light emission.

Another object of the invention is to provide a semiconductor light-emitting diode whereupon a reliable ohmic contact can be easily obtained on the surface thereof.

Still another object of the invention is to provide a method for producing a semiconductor light-emitting diode, which ensures the formation of a compensated p-layer in which the content of AlAs is either constant, or varies within fairly narrow limits (2 to 5 at.%), as well as exhibiting high efficiency of emissive recombination, and light emission intensity of the diode thus obtained.

With these and other objects in view, the invention resides in that a semiconductor light-emitting diode comprising a p$^+$-type GaAS substrate, an epitaxial p-layer of a monocrystalline solid solution of GaAlAs doped with Zn, an epitaxial n-layer of a monocrystalline solid solution of GaAlAs doped with Te, and a heterojunction formed between the epitaxial p- and n-layers which are doped to approximately the same concentration level, has, according to the invention, a compensated layer of a monocrystalline solid solution of GaAlAs doped with Zn, and Te to a concentration level similar to that in the epitaxial n-layer, with the compensated layer being disposed between the epitaxial layers, and having a thickness commensurate with the diffusion length of the injected charge carriers in the n-layer.

It is advisable to grow the epitaxial n-layer on a portion of the compensated layer.

The epitaxial n-layer may carry an epitaxial $n^+$ layer, with the $n^+$ layer being preferably grown on a portion of the epitaxial n-layer.

It is expedient that an $n^{++}$ layer be grown on a portion of the epitaxial $n^+$ layer.

The presence of the $n^+$ layer provides for low series resistance of the semiconductor diode, and improves the mobility of the charge carriers therein, while the presence of the $n^{++}$ layer ensures reliable ohmic contact without any additional operations involved in growing this layer.

It is also expedient that one of the ohmic metal contacts be applied to the surface of the last epitaxial layer, and the other ohmic metal contact be applied to the substrate.

The objects of the present invention are also attained by the fact that a method for producing a semiconductor light-emitting diode consists, according to the invention, in taking a GaAs substrate, and two liquid phases of Ga with Al saturated with arsenic, bringing one of the liquid phases, doped with Zn and Te, into contact with the substrate, growing the p-layer, leaving a layer of this liquid phase on the substrate, controlled as to its thickness, bringing the second liquid phase doped with Te into contact with this layer, and alternately growing the compensated, and n-type layers.

It is expedient to speed up the crystallization of the second liquid phase from 15- to 30-fold for growing the epitaxial $n^+$ layer.

For growing the $n^{++}$ layer, the crystallization rate of the second liquid phase should preferably be further increased from 2 to 3 times.

Other objects, advantages and features of the invention will become evident from the following detailed description of specific embodiments thereof, with reference to the accompanying drawings, wherein:

FIG. 1 is a longitudinal sectional view of a semiconductor light-emitting diode, according to the invention;

FIG. 2 is a longitudinal sectional view of a semiconductor light-emitting diode with an epitaxial $n^+$ layer, according to the invention;

FIG. 3 is a longitudinal sectional view of a semiconductor light-emitting diode with epitaxial $n^+$ and $n^{++}$ layers, according to the invention;

FIG. 4 is a longitudinal sectional view of a semiconductor light-emitting diode with the epitaxial n-layer grown on a part of the compensated layer, according to the invention;

FIG. 5 is a longitudinal sectional view of a semiconductor light-emitting diode with the epitaxial $n^+$ layer grown on a part of the n-layer, according to the invention;

FIG. 6 is a longitudinal sectional view of a semiconductor light-emitting diode with the epitaxial $n^+$ and $n^{++}$ layers grown on a part of the n-layer, according to the invention;

FIG. 7 is a longitudinal sectional view of a semiconductor light-emitting diode with the epitaxial n-layer grown on a portion of the compensated layer, and the $n^+$ layer grown on a portion of the n-layer, according to the invention;

FIG. 8 is a longitudinal sectional view of a semiconductor light-emitting diode with the $n^+$ layer grown on a portion of the n-layer, and the $n^{++}$ layer grown on a portion of the $n^+$ layer, according to the invention;

FIG. 9 is a longitudinal sectional view of a semiconductor light-emitting diode with the $n^+$ and $n^{++}$ layers grown on a portion of the n-layer, according to the invention;

FIG. 10 is a longitudinal sectional view of a semiconductor light-emitting diode with the n-layer grown on a portion of the compensated layer, and the $n^+$ and $n^{++}$ layers grown on a portion of the n-layer, according to the invention;

Figure 12:
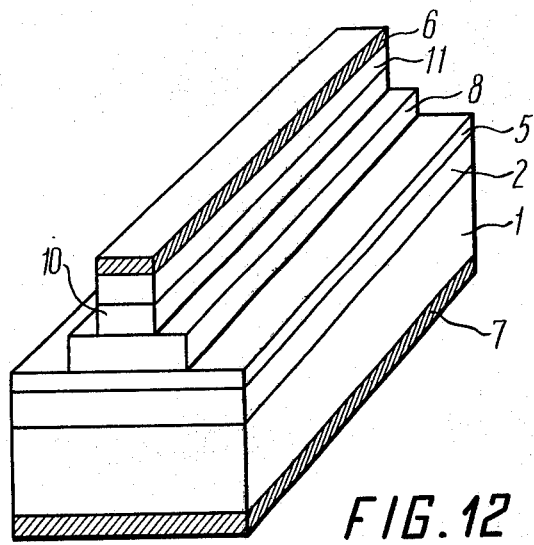

FIG. 11 is a longitudinal sectional view of a semiconductor light-emitting diode with the n-layer grown on a portion of the compensated layer, the $n^+$ layer grown on a portion of the n-layer, and the $n^{++}$ layer grown on a portion of the $n^+$ layer, according to the invention; and FIG. 12 is a general longitudinally cut axonometric view of a semiconductor light-emitting diode with the n-layer grown on a portion of the compensated layer, and the $n^+$ and $n^{++}$ layers grown on a part of the n-layer, according to the invention.

Referring now to the drawings, the semiconductor light-emitting diode comprises a $p^+$-type GaAs substrate 1, and epitaxial layers 2 and 3. The layers 2 and 3 are doped to almost the same concentration level.

The epitaxial p-layer 2 is of a monocrystalline solid solution of GaAlAs doped with Zn to a concentration of from $0.4 \cdot 10^{18}$ to $2 \cdot 10^{18}$ cm$^{-3}$, and is from 16 to 38 m$\mu$ thick, while the epitaxial n-layer 3 is of a monocrystalline solid solution of GaAlAs doped with Te to a concentration of from $0.6 \cdot 10^{18}$ to $5 \cdot 10^{18}$ cm$^{-3}$, and is from 12 to 26 m$\mu$ thick. Formed between the layers 2 and 3 is a heterojunction 4.

According to the invention, the diode also comprises a compensated layer 5 of a monocrystalline solid solution of GaAlAs doped with Zn and Te to the same concentration as the epitaxial n-layer 3. The compensated layer 5 is sandwiched between the epitaxial layers 2 and 3, and has a thickness commensurate with the diffusion length of the injected charge carriers in the n-layer.

The diffusion length that the injected charge carriers is known for a variety of semiconductor materials, and can be determined by any conventional method.

Provided on the surface of the n-layer 3 and the substrate 1 are ohmic metal contacts 6 and 7. These contacts are made of aluminium, nickel, copper, tin, silver, gold and other metals and alloys based on the above metals.

The metal contacts are deposited by any appropriate conventional deposition method, with the contacts exhibiting their ohmic properties immediately on deposition.

The presence of the compensated layer 5 in the diode of the present invention is conducive to an increase in the emissive recombination, which is due to the presence of tails of densities of states in the compensated layer wherein a recombination of the injected charge carriers takes place. This, in turn, is conducive to a sharp decrease in the selfabsorption of emission within the volume of the semiconductor material of the diode.

As can be inferred from FIGS. 1, 2 and 3, the epitaxial n-layer 3 covers the entire surface of the compensated layer 5, and in the diode structure of FIG. 4 the epitaxial n-layer 8 covers the compensated layer 5 only partially.

The epitaxial n-layer 3 (8) carries an epitaxial $n^+$ layer 9 (FIG. 2 or 3) which is based on a monocrystalline solid solution of GaAlAs doped with Te, with the charge carrier concentration therein being from $0.8 \cdot 10^{18}$ to cm $8.0.10^{18}$ and with the thickness of the layer being from 4 to 8 m$\mu$; the composition of this layer is arbitrary with respect to AlAs.

It can be seen from FIGS. 2 and 3 that the $n^+$ layer 9 covers the entire surface of the n-layer 3 which, in turn, covers the entire surface of the compensated layer 5, while in the structure of FIG. 5, the $n^+$ layer 10 covers part of the surface of the n-layer 3. Shown in FIGS. 6 through 11 are embodiments of the semiconductor light-emitting diode, in which the n-layer 8 partially covers the compensated layer 5 (FIGS. 6, 7, 10 and 11), and the $n^+$ layer 10 covers the surface of the n-layer 8 fully (FIG. 6) or partially (FIGS. 7, 8, 9, 10 and 11).

Due to the presence of the $n^+$ layer, the diode has a low series resistance, and features high mobility of the charge carriers therein.

According to the invention, the diode comprises an epitaxial $n^{++}$ layer 11 (FIG. 3) which covers the epitaxial $n^+$ layer 9, and is based on a monocrystalline solid solution of GaAlAs doped with Te, with the charge carrier concentration therein being from $0.3 \cdot 10^{19}$ to $1.0 \cdot 10^{19}$ cm$^{-3}$, and with the thickness of the layer being from 10 to 20 m$\mu$; the composition of this layer with respect to AlAs is arbitrary also.

The $n^{++}$ layer 11 covers the entire surface of the $n^+$ layer 9 (10) (FIGS. 3, 9 and 10), or a part thereof (FIG. 11).

Therewith, the ohmic metal contact 6 is deposited on the $n^{++}$ layer 11, with the presence of the latter in the diode structure enhancing the reliability of the contact 6 and simplifying its deposition.

FIG. 12 shows axonometrically the diode of FIG. 10 so to more fully illustrate the features of the present invention.

For a better understanding of the present invention, given below are specific examples of embodying the semiconductor light-emitting diode disclosed herein.

EXAMPLE 1.

The diode comprises the following layers:

1. a $p^+$-type GaAs substrate with a charge carrier concentration $n_p = 8 \cdot 10^{18}$ cm$^{-3}$, orientation [100] $\pm$ 5', and a hole mobility $\mu_p = 120$ cm$^2$/V.sec;

2. an epitaxial p-layer with a charge carrier concentration $n_p = 10^{18}$ cm$^{-3}$, a thickness $d = 24$ m$\mu$, and an AlAs content of about 34 at.%;

3. a compensated p-layer with a charge carrier concentration $n_p = 5 \cdot 10^{17}$ cm$^{-3}$, a thickness $d \sim 2$ m$\mu$, and an AlAs content of about 43 at.%;

4. an epitaxial n-layer with an electron concentration $n_e = 2 \cdot 10^{18}$ cm$^{-3}$, a thickness $d \sim 14$ m$\mu$, and an AlAs content of about 43 at.%.

The characteristics of this diode are as follows:
the emission energy $E_{ev} \approx 1.85$ eV; external quantum efficiency $r = 1.2\%$; emission intensity B = 5,000 cd/m² at a current density $j = 10$ A/cm².

EXAMPLE 2.

1. a p⁺-type GaAs substrate: $n_p = 2 \cdot 10^{19}$ cm⁻³; orientation [100]± 30'; $\mu_p = 80$ cm²/V.sec;
2. an epitaxial p-layer: $n_p = 10^{18}$ cm⁻³; $d = 18$ mμ; AlAs content of about 32 at.%;
3. a compensated p-layer: $n_p = 5 \cdot 10^{17}$ cm⁻³; $d \sim 2$ mμ; AlAs content of about 32 at.%;
4. an epitaxial n-layer: $n_e = 2 \cdot 10^{18}$ cm⁻³; $d = 16$ mμ; AlAs content of 45 at.%.

Diode characteristics: $E_{ev} \approx 1.83$ eV; $r = 0.8\%$; B = 3,200 cd/m² at $j = 10$ A/cm².

EXAMPLE 3.

1. a p⁺-type GaAs substrate: $n_p = 4 \cdot 10^{19}$ cm⁻³; orientation [100]± 1°; $\mu_p = 65$ cm²/V·sec;
2. a p-layer: $n_p = 2 \cdot 10^{18}$ cm⁻³; $d = 24$ mμ; AlAs content of about 34 at.%;
3. a compensated p-layer: $n_p = 3 \cdot 10^{17}$ cm⁻³; $d = 1.5$ mμ; AlAs content of about 34 at.%;
4. an n-layer: $n_e = 7 \cdot 10^{17}$ cm⁻³; $d = 12$ mμ; AlAs content of about 34 at.%.

Diode characteristics: $E_{ev} = 1.85$ eV; $r = 0.5\%$; B = 2,600 cd/m² at j = 10 A/cm².

EXAMPLE 4.

1. a p⁺-type GaAs substrate; $n_p = 2 \cdot 10^{19}$ cm⁻³; orientation [100] 30 $\mu_p = 105$ cm²/V.sec;
2. a p-layer: $n_p = 3 \cdot 10^{18}$ cm⁻³; $d = 32$ mμ; AlAs content of about 32 at.%;
3. a compensated p-layer: $n_p = 4 \cdot 10^{17}$ cm⁻³; $d \sim 2$ mμ; AlAs content of about 34 at.%;
4. an n-layer: $n_e = 10^{18}$ cm⁻³; $d = 18$ mμ; AlAs content of about 44 at.%.

Diode characteristics: $E_{ev} \approx 1.83$ Ev; $r = 0.7\%$; B = 2,900 cd/m² at $j = 10$ A/cm².

EXAMPLE 5.

1. a p⁺-type GaAs substrate: $n_p = 10^{19}$ cm⁻³; orientation [100]± 5'; $\mu_p = 140$ cm²/V.sec;
2. a p-layer; $n_p = 3 \cdot 10^{18}$ cm⁻³; $d = 18$ mμ; AlAs content of about 35 at.%;
3. a compensated p-layer: $n_p = 7 \cdot 10^{17}$ cm⁻³; $d = 2$ mμ; AlAs content of about 35 at.%;
4. an n-layer: $n_e = 7 \cdot 10^{17}$ cm⁻³; $d = 14$ mμ; AlAs content of about 42 at.%.

Diode characteristics: $E_{ev} = 1.85$ eV; $r = 0.8\%$; B = 4,200 cd/m² at $j = 10$ A/cm².

EXAMPLE 6.

The substrate, p-layer, compensated layer and n-layer are the same as in Example 3. The diode also comprises:

5. an epitaxial n⁺ layer 4 mμ thick and having a charge carrier concentration $n_e^+$ of about $10^{18}$ cm⁻³;
6. an epitaxial n⁺⁺ layer 12 mμ thick and having a charge carrier concentration $n_e^{++}$ of about $4 \cdot 10^{18}$ cm⁻³;
7. the n⁺ and n⁺⁺ layers are partially removed by means of an etchant (H₂SO₄ : H₂O₂ : H₂0 = 3:1:1);
8. the ohmic contacts are made of nickel.

The diode characteristics are the same as in Example 3.

EXAMPLE 7.

1. a p⁺-type GaAs substrate: $n_p = 4.10^{19}$ cm⁻³; orientation [100]±5'; $\mu_p = 100$ cm²/V.sec;
2. a p-layer; $n_p \approx 10^{18}$ cm⁻³; $d = 26$ mμ; AlAs content of about 34 at.%;
3. a compensated layer: $n_p \approx 5 \cdot 10^{17}$ cm⁻³; $d = 2$ mμ; AlAs content of about 34 at.%;
4. an n-layer: $n_e \approx 2.10^{18}$ cm⁻³; $d = 12$ mμ; AlAs content of about 43 at.%;
5. an epitaxial n⁺ layer: $d = 6$ mμ; $n^+_e \approx 4 \cdot 10^{18}$ cm⁻³;
6. the n⁺ layer is partially removed by means of an etchant (H₂SO₄ : H₂O₂ = 1:1);
7. the ohmic contacts are made of gold.

EXAMPLE 8.

The substrate, p-layer, compensated layer and n-layer are the same as in Example 4.

5. an epitaxial n⁺ layer; $d = 4$ mμ; $n_e^+ \approx 3 \cdot 10^{18}$ cm⁻³;
6. an epitaxial n⁺⁺ layer; $d = 10$ mμ; $n_e^{++} \approx 6 \cdot 10^{18}$ cm⁻³;
7. the n⁺⁺ layer is partially removed by means of an etchant (H₂SO₄ : H₂O₂: H = 3:1:1).

The recombination emission traverses the n and n⁺ layers.

8. the ohmic contacts are made of gold.

Diode characteristics: $E_{ev} \approx 1.83$ eV; $r = 0.8\%$; B = 3,100 cd/m² at $j = 10$ A/cm².

EXAMPLE 9.

The substrate, p-layer, compensated layer, n-layer and n⁺ layer are the same as in Example 6.

6. an epitaxial n⁺⁺ layer: $d = 16$ mμ; $n_e^{++} \approx 6 \cdot 10^{18}$ cm⁻³;
7. the n⁺ and n⁺⁺ layers are partially removed by means of an etchant (H₂SO₄ : H₂O₂ = 1:1);
8. the ohmic contacts made of aluminium.

Diode characteristics: $E_{ev} \approx 1.85$ eV; r = 0.6%; B = 2,900 cd/m² at $j = 10$ A/cm².

EXAMPLE 10.

The substrate, p-layer, compensated layer and n-layer are the same as in Example 5.

5. an n⁺ layer: $d = 8$ mμ; $n_e \approx 10^{18}$ cm⁻³; the recombination emission traverses the n and n⁺ layers;
6. the ohmic contacts are made of an alloy Au:Ge = 97:3, fused in at a temperature of 560°C.

Diode characteristics: $E_{ev} \approx 1.85$ eV; $r \approx 0.9\%$; B = 4,400 cd/m² at $j = 10$ A/cm².

EXAMPLE 11.

1. a p⁺-type GaAs substrate: $n_p = 5 \cdot 10^{19}$ cm⁻³; orientation [100] 30$\mu_p = 130$ cm²/V.sec;
2. a p-layer: $n_p \approx 2 \cdot 10^{18}$ cm⁻³; $d = 22$ mμ; AlAs content of about 34 at.%; 3. a compensated layer: $n_p \approx 6 \cdot 10^{17}$ cm⁻³; $d = 2$ mμ; AlAs content of about 34 at.%;
4. an n-layer: $n_e \approx 4 \cdot 10^{18}$ cm⁻³; $d = 16$ mμ; AlAs content of about 47 at.%;
5. an n⁺ layer: $d = 8$ mμ; $n_e^+ \approx 8 \cdot 10^{18}$ cm⁺³;
6. the n⁺ layer is partially removed by means of an etchant (H₂SO₄ : H₂O₂ = 3:1);
7. the ohmic contacts are made of gold. Diode characterkstics: $E_{ev} \approx 1.84$ eV; $r \approx 0.9\%$; B = 3,900 cd/m² at $j = 10$ A/cm².

According to the invention, the method for producing the above-disclosed semiconductor light-emitting diode consists in the following;

First, a GaAs substrate, and two liquid phases of Ga with Al saturated with arsenic are taken. The process is conducted in an open system, in a flow of pure hydrogen. A charging container with a graphite magazine containing the GaAs substrate, and melts is used for growing epitaxial layers. The GaAs substrate is placed in a compartment of the magazine.

The composition of the charge for growing the p-layer, and a compensated layer of a monocrystalline solid solution (first liquid phase) is as follows:

Ga — 5.0 ± 0.1 g
GaAs — 480 ± 40 mg
Al — 11.6 ± 0.4 mg
Zn — 22 ± 4 mg
Te — 0.07 ± 0.01 mg

The composition of the charge for growing the n-layer of a monocrystalline solid solution (second liquid phase) is as follows:

Ga - 5.0 ± 0.1 g
GaAs - 580 ± 40 mg
Al - 15.6 ± 0.6 mg
Te - 2.2 ± 0.3 mg.

The magazine with the substrate and melts is placed in a quartz reaction vessel with hydrogen purified to the dew point (60 ± 15)°C circulating therethrough. The magazine with its contents is kept horizontal in a temperature field of 960° ± 5°C.

In order to attain saturation in the melts (liquid phases), they are allowed to stand for from 30 to 40 min, then the first liquid phase is brought into contact, by manipulating the magazine, with the substrate, whereupon a programmed cooling device is immediately switched on thus ensuring a cooling rate of from 0.3 to 0.5 °C/min. As the system is cooled by from 12 to 20°C, the epitaxial p-layer is grown. As soon as this layer has been grown, layer of from a 300 to 500 m$\mu$ thick of the first liquid phase is left on the substrate, and the second liquid phase is immediately brought into contact therewith. This is accompanied by a spontaneous growth of the compensated p-layer.

As the system is further cooled by from 16 to 34°C, the epitaxial n-layer is grown after the compensated p-layer. Then, the rate of cooling is increased from 15- to 30-fold to grow the epitaxial $n^+$ layer and, finally, the rate of crystallization is further increased from 2 to 3 times so to grow the epitaxial $^n n^{++}$ layer.

At the end of the process, the liquid melt is partially, or fully removed from the substrate.

EXAMPLE 12.

The substrate material used is a p-type GaAs.
The composition of the first liquid phase is as follows:

Ga — 5.06 g
GaAs — 485 mg
Al — 11.5 mg
Zn — 20 mg
Te — 0.06 mg.

The composition of the second liquid phase is:

Ga — 5.1 g
GaAs — 600 mg
Al — 15.6 mg
Te — 2.0 mg

The semiconductor diode structure is grown in the above manner under the following conditions;

The process is conducted at a temperature of 963°C with the magazine with the contents being kept at this temperature for 30 min. The rate of cooling of the system after the first liquid phase has been brought into contact with the substrate is 0.3 °C/min. The cooling interval for growing the p-layer is from 963 to 945°C. The thickness of the first liquid phase layer left on the substrate is 450 m$\mu$. At a temperature of 945°C, the second liquid phase is brought into contact with the first liquid phase layer left on the substrate, and as the system is further cooled by 24°C at a rate of 0.3°C/min, the n-layer is grown.

After the n-layer has been grown, the cooling rate is increased by from 15- to 30-fold to grow the epitaxial $n^+$ layer. Further increase of the rate of cooling of from 2 to 3 times enables the growth of the epitaxial $n^{++}$ layer. It only takes a few minutes for the latter two layers to be grown.

The proposed semiconductor light-emitting diode features a high efficiency of emissive recombination, and a high intensity of light emission. It is also characterized by low series resistance. The presence of the $n^{++}$ layer ensures reliable ohmic contact without any additional operations involved in its deposition.

What is claimed is:

1. A semiconductor light-emitting diode comprising: a $p^+$-type GaAs substrate; and epitaxial p-type layer of a monocrystalline solid solution of $Al_{x_1}Ga_{1-x_1}As$ doped with Zn grown on said $p^+$-type substrate; an epitaxial n type layer of monocrystalline solid solution of $Ga_{1-x_3}Al_{x_3}A_s$ doped with Te; a $p_c$-type compensated layer of a monocrystalline solid solution of $Al_{x_2}Ga_{1-x_2}As$ doped with Zn and Te to a concentration less than or equal to the concentration of the n type epitaxial layer, disposed between said epitaxial layers and having a thickness less than or equal to the length of diffusion of the injected carriers of current in said n type epitaxial layer; a basic heterojunction being formed between said epitaxial p-type and n-type layers.

2. The diode as claimed in claim 1, wherein said epitaxial n-layer is grown on a portion of said compensated layer.

3. The diode as claimed in claim 1, wherein an epitaxial $n^+$-type layer of $Al_{x_4}Ga_{1-x_4}As$ is grown on said n-type epitaxial layer.

4. The diode as claimed in claim 2, wherein an epitaxial $n^+$ layer is grown on said epitaxial n-layer.

5. The diode as claimed in claim 3, wherein said epitaxial $n^+$ layer is grown on a portion of said epitaxial n-layer.

6. The diode as claimed in claim 4, wherein said epitaxial $n^+$ layer is grown on a portion of said epitaxial n-layer.

7. The diode as claimed in claim 3, wherein epitaxial $n^{++}$-type layer of $Al_{x_5}Ga_{1-x_5}As$ is grown on said epitaxial $n^+$-type layer.

8. The diode as claimed in claim 4, wherein an epitaxial $n^{++}$ layer is grown on said epitaxial $n^+$ layer.

9. The diode as claimed in claim 5, wherein an epitaxial $n^{++}$ layer is grown on said epitaxial $n^+$ layer.

10. The diode as claimed in claim 6, wherein an epitaxial $n^{++}$ layer is grown on said epitaxial $n^+$ layer.

11. The diode as claimed in claim 7, wherein said epitaxial $n^{++}$ layer is grown on a portion of said epitaxial $n^+$ layer.

12. The diode as claimed in claim 8, wherein said epitaxial $n^{++}$ layer is grown on a portion of said epitaxial $n^+$ layer.

13. The diode as claimed in claim 9, wherein said epitaxial $n^{++}$ layer is grown on a portion of said epitaxial $n^+$ layer.

14. The diode as claimed in claim 10, wherein said epitaxial $n^{++}$ layer is grown on a portion of said epitaxial $n^+$ layer.

15. The diode as claimed in claim 1, wherein an ohmic metal contact is deposited on said substrate on the side opposite to that where said epitaxial p-layer 16. A semiconductor light-emitting diode comprising: a $p^+$-type GaAs substrate; an epitaxial p-type layer of a monocrystalline solid solution of $Al_{x_1}Ga_{1-x_1}As$ doped with Zn grown on said $p^+$-type substrate; an epitaxial n-type layer of a monocrystalline solid solution of $Al_{x_3}Ga_{1-x_3}As$ doped with Te; a compensated Pc-type layer of monocrystalline solid solution of $Al_{x_2}Ga_{1-x_2}As$ doped with Zn and Te to a concentration in the Pc-type layer less than or equal to the concentration of the n type epitaxial layer, disposed between said epitaxial layers and having a thickness less than or equal to the length of diffusion of the injected carriers of current in said $n$ type layer; a basic heterojunction arranged between said epitaxial p-type and n-type layers; a first ohmic metal contact deposited on a part of the surface of said epitaxial n-type layer; and the second ohmic metal contact deposited on said substrate on the side opposite to that where said epitaxial p-type layer has been grown.

17. A semiconductor light-emitting diode comprising: a $p^+$-type GaAs substrate having a charge carrier concentration of 0.8 to $5 \times 10^{19}$ cm$^{-3}$; an epitaxial p-layer of a monocrystalline solid solution of GaAlAs doped with Zn to a concentration of $0.4-2 \times 10^{18}$ cm$^{-3}$, grown on said substrate; an epitaxial n-layer of a monocrystalline solid of GaAlAs doped with Te to a concentration of 0.6 to $5 \times 10^{18}$ cm$^{-3}$, grown on said p-layer; said epitaxial p- and n-layers being doped to approximately the same concentration level; a compensated layer of a monocrystalline solid solution of GaAlAs doped with Zn and Te to a concentration level approximately equal to that in said epitaxial n-layer, with said compensated layer being arranged between said epitaxial p- and n-layers, and having a thickness of 1.5 to 2.0 microns, commensurate with the diffusion length of the injected charge carriers in said n-layer, thereby forming a hetrojunction between said epitaxial layers.

* * * * *